United States Patent [19]

Shimada

[11] Patent Number: 4,880,663
[45] Date of Patent: * Nov. 14, 1989

[54] METHOD FOR APPLYING A MOISTUREPROOF INSULATIVE COATING TO PRINTED CIRCUIT BOARDS USING TRIANGULAR OR DOVETAIL SHAPED LIQUID FILMS EMITTED FROM A FLAT-PATTERN NOZZLE

[75] Inventor: Takaji Shimada, Kawaguchi, Japan

[73] Assignee: Nordson Corporation, Westlake, Ohio

[ * ] Notice: The portion of the term of this patent subsequent to Jun. 28, 2005 has been disclaimed.

[21] Appl. No.: 206,199

[22] Filed: Jun. 13, 1988

Related U.S. Application Data

[63] Continuation-in-part of Ser. No. 941,365, Dec. 15, 1986, Pat. No. 4,753,819.

[30] Foreign Application Priority Data

Dec. 27, 1985 [JP] Japan .................................. 60-294768

[51] Int. Cl.$^4$ ................................................ B05D 5/12
[52] U.S. Cl. .................................... 427/96; 427/207.1; 427/420; 427/421
[58] Field of Search ............... 427/96, 420, 421, 207.1

[56] References Cited

U.S. PATENT DOCUMENTS 3,526,535  9/1970  Plumat .................................. 427/420
3,852,095  12/1974  Hogstrom .
4,337,281  6/1982  Boone .
4,490,496  12/1984  Maekawa .............................. 427/96
4,600,601  7/1986  Tamura .
4,711,835  12/1987  Dufour ................................. 427/96
4,753,819  6/1988  Shimada ........................... 427/207.1

FOREIGN PATENT DOCUMENTS

WO86/03366  6/1986  PCT Int'l Appl. .
1403776  8/1975  United Kingdom .

OTHER PUBLICATIONS

IBM Technical Disclosure Bulletin, vol. 7, No. 11, Apr. 1965.

Primary Examiner—Shrive Beck
Assistant Examiner—Vi Duong Dang
Attorney, Agent, or Firm—Wood, Herron & Evans

[57] ABSTRACT

A method of applying coating material to only selected areas of a packaged printed circuit board wherein the coating material is supplied to a flat-pattern nozzle at a pressure sufficient to produce a liquid film emission in a flat triangular or dovetail shaped pattern which portion of the nozzle emission is substantially free of atomized particles. The circuit board is positioned relative the nozzle to place the board in the path of the film pattern and relative movement between the nozzle and board is effect in conjunction with controlling the supply of coating to the nozzle to coat only desired regions of the board while avoiding deposit of coating material on areas to be left uncoated.

7 Claims, 4 Drawing Sheets

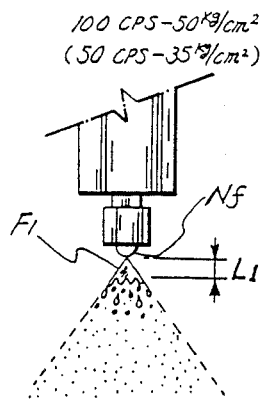 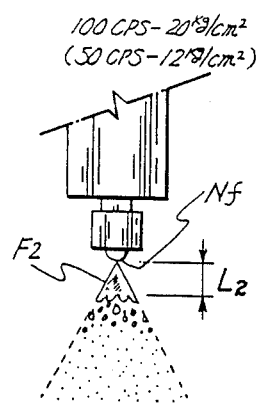 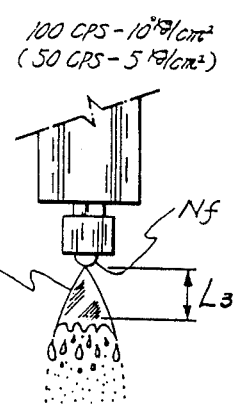
FIG. 6     FIG. 7     FIG. 8
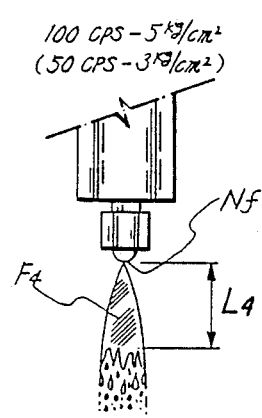 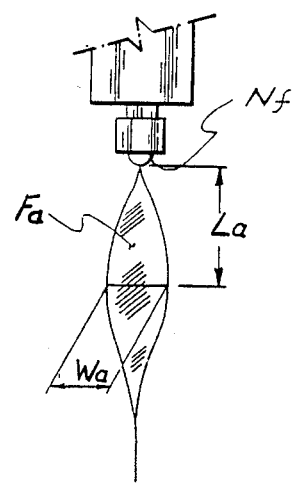 
FIG. 9     FIG. 10A     FIG. 10B

METHOD FOR APPLYING A MOISTUREPROOF INSULATIVE COATING TO PRINTED CIRCUIT BOARDS USING TRIANGULAR OR DOVETAIL SHAPED LIQUID FILMS EMITTED FROM A FLAT-PATTERN NOZZLE

This application is a continuation-in-part of application Ser. No. 06/941,365, filed Dec. 15, 1986, now U.S. Pat. No. 4,753,819 entitled METHOD FOR APPLYING A MOISTUREPROOF INSULATOR COATING ON PACKAGED CIRCUIT BOARDS, in the name of Takaji Shimada, which is assigned to Nordson Corporation, the assignee of the present continuation-in-part application. The entire disclosure of the aforesaid Shimada application Ser. No. 06/941,365 is specifically incorporated herein by reference.

This invention relates to the coating of moistureproof insulator films on printed circuit boards to protect the circuit boards from moisture, electric leakage and dust. Preferably, the moistureproof insulator films are what are known as conformal coatings, such as, acrylic, polyurethane, or epoxy synthetic resins dissolved in a volatile solvent. One conformal coating found satisfactory is available from Humiseal Division, Columbia Chase Corp., Woodside, N.Y., under the trademark "HumiSeal 1B31". When applied to clean printed circuit boards, a uniform thickness insulative resin film, without pinholes, is formed as the solvent evaporates on a continuous basis.

In the past, five principal methods have been used to apply coatings of moistureproof insulators to printed circuit boards. These included the following:

(a) The immersion method, in which packaged circuit boards are immersed in an immersion tank containing the moistureproof insulator.

(b) The brush-coating method, in which the moistureproof insulator is applied by a brush to the printed circuit board surface to be coated.

(c) The roller method, in which a sheep's wool roll impregnated with the moistureproof insulator is rolled on the surface of the printed circuit board to thereby provide the insulative coating thereon.

(d) The spray method, in which the moistureproof insulator is applied to the printed circuit board by spraying techniques.

(e) The slit die method, in which the moistureproof insulator is pressurized and extruded from a slit die to eject a film for coating the printed circuit board surface.

As detailed in the above-referenced Shimada application, each of the foregoing methods have certain advantages and disadvantages. For example, all methods except brush-coating require masking for those parts to be left uncoated. The masking operations, that is, mounting and removal of the masks, must be done manually, causing a bottleneck in the mass production process. Brush-coating, while not requiring masking, is labor-intensive, and otherwise unsuitable for mass production.

As also described in the above-referenced Shimada application, the most commonly used insulative coating method is the spraying method. Spraying can be categorized as either air spraying in which an air stream is impinged against the stream of liquid coating material to atomize it, and airless spraying in which atomization of the coating material is achieved by subjecting the liquid coating material to very high pressures such that after emission from the nozzle it becomes atomized. In air spraying almost no liquid droplets are in the spray pattern ejected from the nozzle. Whereas, in airless spraying, especially in flat pattern spraying, a small quantity of liquid can be seen in the form of a triangular or dovetail-shaped liquid film near the nozzle opening, which extends from the nozzle a distance D. This liquid film is referred to as a "dovetail" or "tail". Beyond the distance D, atomization occurs. Depending upon the pressure used to eject the liquid coating from the airless nozzle, which typically ranges between 40 $Kg/cm^2$ and 80 $Kg/cm^2$, and the viscosity of the coating material, the length D of the dovetail or triangular liquid film generally approximates 5 mm–8 mm.

Illustrative of prior patents disclosing the coating of articles with a 5 mm–8 mm dovetail or triangular liquid film from an airless spray nozzle operating pressure of 40 $Kg/cm^2$ or more are U.S. Pat. Nos. 3,852,095 and 4,337,281. U.S. Pat. No. 3,852,095 discloses the application of a film of wax to the rim of a can end before the end is assembled to the body of a can. U.S. Pat. No. 4,337,281 discloses striping the inside seam of welded cans to protect the contents of the can against metal contamination.

Airless spray coating of insulative material on printed circuit boards, with the 5 mm–8 mm length dovetail or triangular liquid film produced using pressures in excess of 40 $Kg/cm^2$ has, as described in the foregoing Shimada application, produced certain problems. These include splashing, nonuniformity in coating thickness, and a width for the strip-like coating which is relatively narrow. Also, since the distance between the nozzle and the substrate to be coated is relatively short, it is difficult to coat printed circuit boards, especially those with varying height circuit components mounted thereon which afford a non-flat surface.

In accordance with the invention disclosed and claimed in the above-referenced Shimada application, printed circuit boards could be coated with an insulator coating of surprisingly high quality in terms of coating thickness uniformity and the absence of splashing, by supplying the liquid coating material to an airless flat-patterned nozzle at a supply pressure, e.g., 5 $Kg/cm^2$ for a 100 cps viscosity coating, such that a liquid film emission from the nozzle is produced in the form of a flat leaf pattern. The leaf-shaped liquid film, which is substantially free of atomized particles, has a maximum width $W_a$ at its approximate center, which decreases on both sides of the center to an approximately zero width at a distance $L_a$ from the center. The nozzle and printed circuit board are positioned at a specified distance apart relative to each other to locate the circuit board in the path of the flat leaf-shaped liquid film pattern, preferably at the distance $L_a$ from the nozzle where the width of the leaf-shaped liquid film is at its maximum width $W_a$.

The aforesaid Shimada application, particularly in FIGS. 8–11 thereof and the associated text of the application which describes these figures, discloses that 100 cps viscosity insulator coating when subjected to pressures of 50 $Kg/cm^2$, 20 $Kg/cm^2$, 10 $Kg/cm^2$ and 5 $Kg/cm^2$ produces dovetail or triangular liquid film patterns, in contrast to leaf-shaped liquid film patterns of the type described in the preceding paragraph, having liquid film lengths of 5 mm, 8 mm, 9 mm, and 12 mm, respectively. The same dovetail or triangular liquid film lengths of 5 mm, 8 mm, 9 mm, and 12 mm can be achieved with an insulator coating viscosity of 50 cps at pressures of 35 $Kg/cm^2$, 12 $Kg/cm^2$, 5 $Kg/cm^2$ and 3 $Kg/cm^2$, respectively. Dovetail or triangular liquid films of the foregoing type, designated F1, F2, F2, and F4, are depicted in FIGS. 8, 9, 10 and 11, respectively, of the above-referenced Shimada application.

As noted in the above-referenced Shimada application, splashing occurred when the film F4 of FIG. 11 thereof was used to coat the surface of a printed circuit board. This was attributed to the liquid ejection pressure of 5 Kg/cm$^2$. In accordance with the invention disclosed and claimed in the above-referenced Shimada application, splashless coating occurred only when the liquid pressure of a 100 cps viscosity coating lowered to 2 Kg/cm$^2$ and the dovetail or triangular film changed to a "leaf" shape Fs, such as shown in FIG. 13A of the Shimada application.

It has now been discovered that under certain circumstances splashless uniform-thickness coatings of insulator material can be provided on printed circuit boards with dovetail or triangular shaped liquid films emitted from an airless flat-pattern spray nozzle. More particularly, it has been discovered that at discharge pressures equivalent to approximately 8 Kg/cm$^2$ or less for insulative coatings having viscosities in the approximate range of 125–155 cps, substantially splash-free uniform thickness coatings can be deposited where the distance between the nozzle and the printed circuit board to be coated is approximately 10 mm or less. Splash-free uniform thickness coatings can be achieved as the nozzle-to-substrate distance increases from 10 mm to 20 mm by decreasing the discharge pressure from a pressure equivalent to 6 Kg/cm$^2$ for a 125 cps viscosity coating to a pressure equivalent to 2.7 Kg/cm$^2$ for a 125 cps viscosity coating.

In a preferred form of the invention, the pressure and viscosity of the coating are selected to produce a triangular or dovetail shaped liquid film, and the distance between the nozzle and the surface of the printed circuit board to be coated is selected such that it does not exceed approximately two-thirds "L", where "L" is the distance between the nozzle and the horizontal base edge of the dovetail or triangular liquid film below which the solid liquid film begins to break up into droplets to form an atomized spray.

These and other objectives, features and advantages of the invention will become more readily apparent from a detailed description of the drawings in which:

FIG. 6 is a front view of the spray pattern from a flat spray pattern airless nozzle for a liquid with a viscosity of 100 cps at 50 Kg/cm$^2$.

FIGS. 7, 8 and 9 are front views of spray patterns from a flat pattern airless nozzle for 100 cps viscosity liquid at pressures of 20 Kg/cm$^2$, 10 Kg/cm$^2$, and 5 Kg/cm$^2$, respectively.

FIG. 10A is a front view of a leaf-shaped film at 2 Kg/cm$^2$ for a 100 cps insulator coating liquid.

FIG. 10B is the side view of the leaf-shaped film of FIG. 10A.

Figure 1:
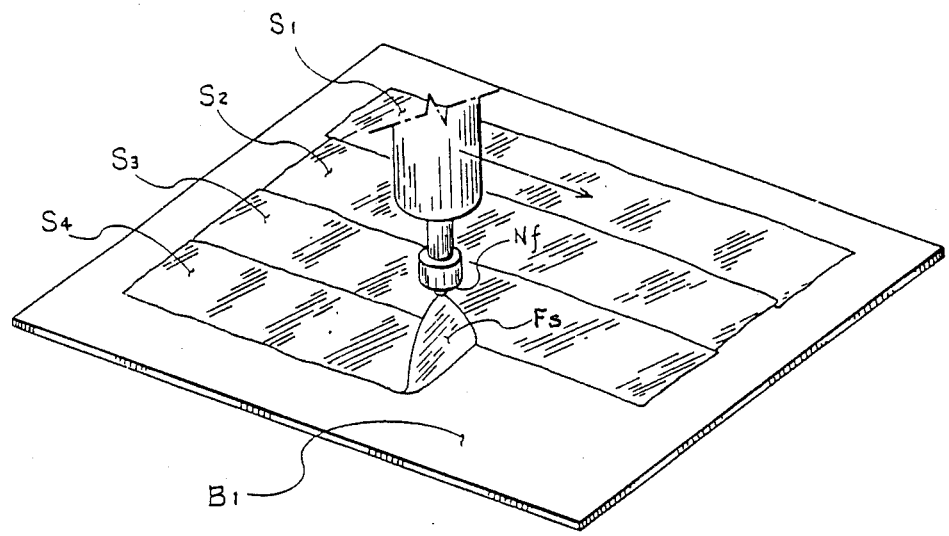
FIG. 1 illustrates the application of coating bands in parallel by a single flat spray pattern airless nozzle according to the invention.
Figure 2:
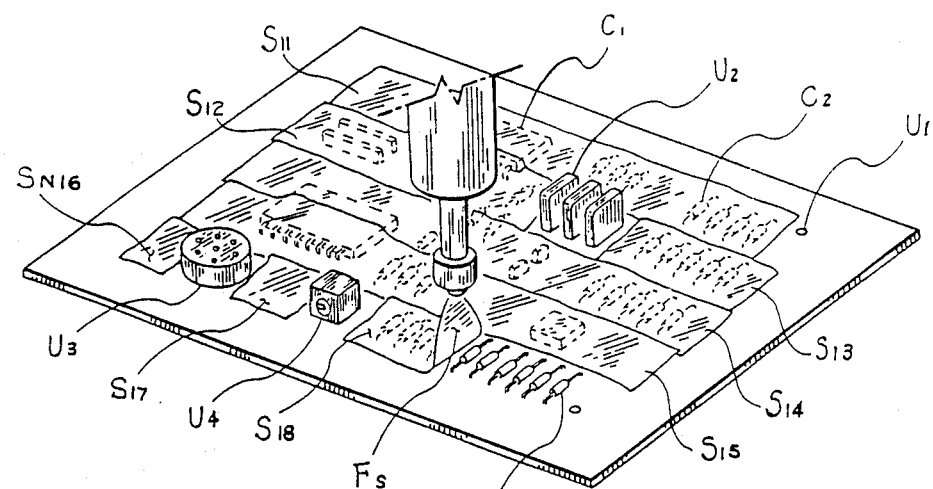
FIG. 2 illustrates the operation of the invention for coating only selected portions of a printed circuit board and leaving other portions uncoated.
Figure 3:
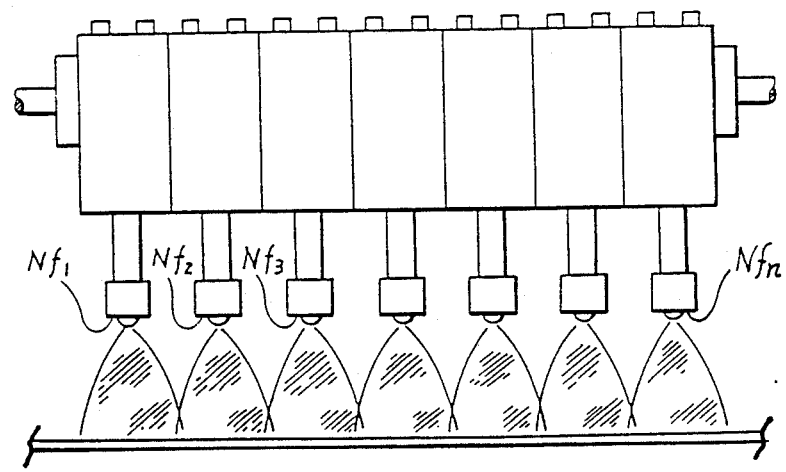
FIG. 3 illustrates the operation of the invention using multiple flat pattern airless nozzles to concurrently apply multiple bands of coating material to a printed circuit board.

As shown in FIG. 1, a substrate of a printed circuit board B1 having circuit components (not shown) thereon is disposed in a generally horizontal plane below a flat fan spray airless nozzle Nf which is adapted to selectively move in orthogonal coordinate directions with respect to the printed circuit board. To provide bands of insulator coating material S1, S2, S3 and S4 on the printed circuit board B1, a triangular or dovetail shaped liquid film Fs is emitted from the nozzle Nf as relative motion between the nozzle and the printed circuit board occurs. With reference to FIG. 2, by selectively terminating and initiating emission of the dovetail or triangular liquid film emitted from the airless nozzle Nf, printed circuit board components U1, U2, U3 and U4 can be left uncoated while components C1, C2 and the like can be coated by applying, on a sequential basis, coating bands S11, S12, S13, S14, S15, S16, S17 and S18. If desired, and with reference to FIG. 3, plural airless nozzles Nf$_1$, Nf$_2$, Nf$_3$ ... Nf$_n$ can be used to simultaneously apply plural bands of coating material to a printed circuit board or other substrate.

Figures 4A, 4B, 5:
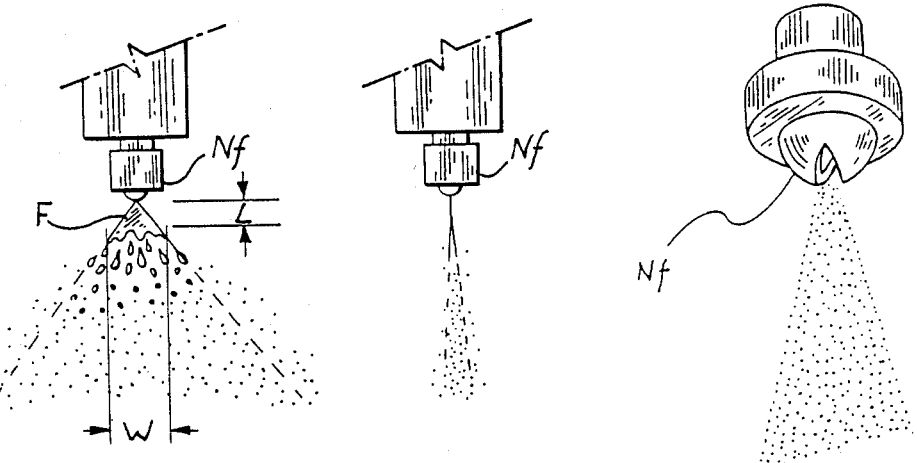
FIG. 4A is a front view of an emission from a flat spray pattern airless nozzle showing the triangular or dovetail shaped liquid portion below which it breaks up into droplets to form an atomized spray.
FIG. 4B is a side view of the airless nozzle emission of FIG. 4A.
FIG. 5 is a perspective view of a flat spray pattern airless nozzle for producing the emission pattern of FIGS. 4A and 4B, viewed from below at an oblique angle.

As shown in FIG. 4A and 4B, when pressurized insulator coating material is emitted from an airless flat-pattern spray nozzle Nf a triangular or dovetail shaped flat liquid film F is produced. The liquid film F has a maximum width W at its lower base edge below which discrete liquid droplets of coating begin to form to eventually provide an atomized cloud of coating material. The width W of the lower base edge of the triangular liquid coating film F decreases from a maximum width at the lower base edge thereof to a width of approximately zero at the upper corner or apex of the triangular film F approximately at the orifice of the nozzle Nf. The height of the triangular liquid film F measured in a vertical direction, which is referenced with the letter L, is a function of the viscosity and pressure applied to the liquid coating. For a given viscosity coating material, the length L of the triangular film F decreases as the pressure is increased. In conventional airless coating applications, wherein pressures are typically in the range of 40 Kg/cm$^2$ to 80 Kg/cm$^2$, the triangular film height is approximately 5 mm–8 mm for a typical coating.

With reference to FIGS. 6–9, triangular films F$_1$, F$_2$, F$_3$, and F$_4$ are shown of increasing triangular film lengths L$_1$, L$_2$, L$_3$ and L$_4$, respectively, for 100 cps insulated coating material at pressures of 50 Kg/cm$^2$, 20 Kg/cm$^2$, 10 Kg/cm$^2$ and 5 Kg/cm$^2$, respectively. If the pressure applied to the 100 cps viscosity insulator coating material is reduced to 2 Kg/cm$^2$ the liquid film converts from a triangular form (such as F$_1$, F$_2$, F$_3$ and F$_4$ shown in FIGS. 6–9) to a leaf-shaped liquid film F$_a$ which has a maximum width W$_a$ at its approximate center and which decreases in width on both sides of the center to an approximately zero width at a distance L$_a$ on each side of the center, with the leaf-shaped film F$_a$ being substantially free of atomized particles of coating. A leaf-shaped liquid film of insulated coating material is shown in FIGS. 10A and 10B.

In accordance with with the disclosure of the above-referenced Shimada application Ser. No. 06/941,365, a uniform thickness coating could be applied in a splash-free manner to a printed circuit board by using a leaf-shaped liquid film, such as film $F_a$ of FIG. 10, and by positioning the nozzle and circuit board such that the circuit board intercepted at least a portion of the liquid film, preferably at the approximate mid-point of the liquid film at a distance $L_a$ from the nozzle orifice where the film width $W_a$ is a maximum.

In accordance with certain of the principles of this invention, it has now been discovered that splashfree uniform thickness coatings of insulated material produced with an airless nozzle can be applied to printed circuit boards with triangular liquid films of the general type shown in FIGS. 4A and 4B, providing the pressure is selected such that it is equivalent to approximately 8 $Kg/cm^2$ or lower for a 125–155 cps viscosity coating, and the distances between the nozzle and substrate is approximately 20 mm or less. Preferably, the distance between the nozzle orifice and the surface of the printed circuit board to be coated with the insulated coating material is no greater than approximately two-thirds "L" where "L" is the distance between the nozzle orifice and the lower base edge of the triangular liquid film below which discrete liquid droplets of coating begin to form to produce an atomized cloud of coating material.

The results of experiments utilizing Hitachi insulative coating "Tuffy" No. 1141, an acryl type insulating material, are set forth below. In each case the speed of the nozzle relative to the substrate being coated was 213 mm per second and the coating temperature was 40° C. In examples 1, 2 and 3, the coating viscosity was 127 cps at 20° C., while in example 4, the coating viscosity was 155 cps at 20° C. In each case the percentage by weight of insulative resin with respect to the total weight of the mixture of resin and solvent material in the coating was 30%.

EXAMPLE 1

| DISTANCE (L) BETWEEN NOZZLE ORIFICE AND SUBSTRATE | | FAN WIDTH AT SUBSTRATE | | | | |
|---|---|---|---|---|---|---|
| | | 3 mm | 5 mm | 8 mm | 10 mm | 12 mm |
| 5 mm | (a) | None | None | None | None | |
| | (b) | 7 mm | 9 mm | 11–12 mm | 12–13 mm | |
| | (c) | 4.5 $Kg/cm^2$ | 5.0 $Kg/cm^2$ | 6.7 $Kg/cm^2$ | 7.8 $Kg/cm^2$ | |
| | (d) | Leaf | Triangular | Triangular | Triangular | |
| 7.5 mm | (a) | None | None | None | None | |
| | (b) | 9–10 mm | 10–11 mm | 12 mm | 14–15 mm | |
| | (c) | 4.8 $Kg/cm^2$ | 6.0 $Kg/cm^2$ | 6.8 $Kg/cm^2$ | 8.0 $Kg/cm^2$ | |
| | (d) | Leaf | Triangular | Triangular | Triangular | |
| 10 mm | (a) | None | None | None | None | None |
| | (b) | 8 mm | 9 mm | 11–12 mm | 13–14 mm | 16–17 mm |
| | (c) | 4.1 $Kg/cm^2$ | 5.0 $Kg/cm^2$ | 5.8 $Kg/cm^2$ | 6.8 $Kg/cm^2$ | 7.6 $Kg/cm^2$ |
| | (d) | Leaf | Leaf | Triangular | Triangular | Triangular |
| 12.5 mm | (a) | None | None | None | Two | 10 |
| | (b) | 8–9 mm | 10 mm | 12 mm | 14 mm | 17 mm |
| | (c) | 4.6 $Kg/cm^2$ | 5.2 $Kg/cm^2$ | 6.0 $Kg/cm^2$ | 6.8 $Kg/cm^2$ | 7.6 $Kg/cm^2$ |
| | (d) | Leaf | Leaf | Leaf | Triangular | Triangular |
| 15 mm | (a) | | One | 3–4 | 10 | |
| | (b) | | 9 mm | 12–13 mm | 14 mm | |
| | (c) | | 5.2 $Kg/cm^2$ | 6.0 $Kg/cm^2$ | 6.7 $Kg/cm^2$ | |
| | (d) | | Leaf | Triangular | Triangular | |

Legend:
(a) Number of splashes within 10 $mm^2$ square area immediately adjacent stripe-shaped deposit.
(b) Insulator coating deposit width on substrate.
(c) Fluid application pressure
(d) Liquid film shape ("leaf" or "triangular")
Note: Nozzle used was commercially available Nordson Corp. Part Number 712-830.

EXAMPLE 2

| DISTANCE (L) BETWEEN NOZZLE ORIFICE AND SUBSTRATE | | FAN WIDTH AT SUBSTRATE | | | | | |
|---|---|---|---|---|---|---|---|
| | | 5 mm | 8 mm | 10 mm | 12 mm | 15 mm | 20 mm |
| 5 mm | (a) | None | None | None | None | | |
| | (b) | 11–12 mm | 15 mm | 18 mm | 22 mm | | |
| | (c) | 2.4 $Kg/cm^2$ | 3.5 $Kg/cm^2$ | 4.5 $Kg/cm^2$ | 6.0 $Kg/cm^2$ | | |
| | (d) | Leaf | Triang. | Triang. | Triang. | | |
| 7.5 mm | (a) | None | None | None | None | None | |
| | (b) | 12 mm | 12 mm | 15 mm | 18 mm | 20 mm | |
| | (c) | 2.3 $Kg/cm^2$ | 3.0 $Kg/cm^2$ | 3.2 $Kg/cm^2$ | 3.9 $Kg/cm^2$ | 4.7 $Kg/cm^2$ | |
| | (d) | Leaf | Leaf | Leaf | Triang. | Triang. | |
| 10 mm | (a) | None | None | None | None | None | None |
| | (b) | 11 mm | 14 mm | 17 mm | 19 mm | 22–23 mm | 26–27 mm |
| | (c) | 2.1 $Kg/cm^2$ | 2.7 $Kg/cm^2$ | 3.4 $Kg/cm^2$ | 3.7 $Kg/cm^2$ | 4.8 $Kg/cm^2$ | 6.3 $Kg/cm^2$ |
| | (d) | Leaf | Leaf | Triang. | Triang. | Triang. | Triang. |
| 12.5 mm | (a) | None | None | None | None | None | None |

-continued
EXAMPLE 2

| DISTANCE (L) BETWEEN NOZZLE ORIFICE AND SUBSTRATE | | FAN WIDTH AT SUBSTRATE | | | | | |
|---|---|---|---|---|---|---|---|
| | | 5 mm | 8 mm | 10 mm | 12 mm | 15 mm | 20 mm |
| | (b) | 10–11 mm | 14–15 mm | 17–18 mm | 18–19 mm | 22–23 mm | 27 mm |
| | (c) | 2.1 Kg/cm² | 2.9 Kg/cm² | 3.3 Kg/cm² | 3.5 Kg/cm² | 4.2 Kg/cm² | 5.9 Kg/cm² |
| | (d) | Leaf | Leaf | Triang. | Triang. | Triang. | Triang. |
| 15 mm | (a) | None | None | None | None | None | None |
| | (b) | 10 mm | 13–14 mm | 18–19 mm | 19 mm | 21 mm | 25–26 mm |
| | (c) | 2.2 Kg/cm² | 2.8 Kg/cm² | 3.4 Kg/cm² | 3.4 Kg/cm² | 3.9 Kg/cm² | 5.0 Kg/cm² |
| | (d) | Leaf | Leaf | Triang. | Triang. | Triang. | Triang. |
| 20 mm | (a) | None | None | None | None | None | None |
| | (b) | 11–12 mm | 14–15 mm | 17 mm | 18–19 mm | 21 mm | 26–27 mm |
| | (c) | 2.5 Kg/cm² | 2.8 Kg/cm² | 3.2 Kg/cm² | 3.3 Kg/cm² | 2.7 Kg/cm² | 4.7 Kg/cm² |
| | (d) | Leaf | Leaf | Triang. | Triang. | Triang. | Triang. |

Legend:
(a) Number of splashes within 10 mm² square area immediately adjacent stripe-shaped deposit.
(b) Insulator coating deposit width on substrate.
(c) Fluid application pressure
(d) Liquid film shape ("leaf" or "triangular")
Note: Nozzle used was commercially available Nordson Corp. Part Number 150-142.

EXAMPLE 3

| DISTANCE (L) BETWEEN NOZZLE ORIFICE AND SUBSTRATE | | FAN WIDTH AT SUBSTRATE | | | | | |
|---|---|---|---|---|---|---|---|
| | | 3 mm | 5 mm | 8 mm | 10 mm | 12 mm | 15 mm |
| 5 mm | (a) | | None | None | None | | |
| | (b) | | 8–10 mm | 12 mm | 14 mm | | |
| | (c) | | 3.3 Kg/cm² | 4.2 Kg/cm² | 6.0 Kg/cm² | | |
| | (d) | | Leaf | Triang. | Triang. | | |
| 7.5 mm | (a) | None | None | None | None | None | One |
| | (b) | 8 mm | 10 mm | 12 mm | 15 mm | 15 mm | 16 mm |
| | (c) | 2.7 Kg/cm² | 3.1 Kg/cm² | 3.8 Kg/cm² | 4.8 Kg/cm² | 4.8 Kg/cm² | 6.0 Kg/cm² |
| | (d) | Leaf | Leaf | Triang. | Triang. | Triang. | Triang. |
| 10 mm | (a) | None | None | None | None | None | 10 |
| | (b) | Varied | 10 mm | 11–12 mm | 14 mm | 16 mm | 17 mm |
| | (c) | 2.6 Kg/cm² | 3.0 Kg/cm² | 3.6 Kg/cm² | 4.5 Kg/cm² | 5.1 Kg/cm² | 6.0 Kg/cm² |
| | (d) | Leaf | Leaf | Leaf | Triang. | Triang. | Triang. |
| 12.5 mm | (a) | None | None | None | 2 | 10–15 | 100 |
| | (b) | 8 mm | 10 mm | 13 mm | 15 mm | 15 mm | 18 mm |
| | (c) | 2.7 Kg/cm² | 3.0 Kg/cm² | 3.6 Kg/cm² | 4.4 Kg/cm² | 4.9 Kg/cm² | 5.9 Kg/cm² |
| | (d) | Leaf | Leaf | Leaf | Triang. | Triang. | Triang. |
| 15 mm | (a) | None | None | None | 40–70 | | |
| | (b) | 8 mm | 9–10 mm | 12–13 mm | 15–16 mm | | |
| | (c) | 2.8 Kg/cm² | 3.1 Kg/cm² | 3.8 Kg/cm² | 4.3 Kg/cm² | | |
| | (d) | Leaf | Leaf | Leaf | Triangular | | |
| 20 mm | (a) | None | 3–4 | 10 | 20 | | |
| | (b) | 9 mm | 10 mm | 13 mm | 16 mm | | |
| | (c) | 3.1 Kg/cm² | 3.3 Kg/cm² | 3.8 Kg/cm² | 4.3 Kg/cm² | | |
| | (d) | Leaf | Leaf | Leaf | Triangular | | |

Legend:
(a) Number of splashes within 10 mm² square area immediately adjacent stripe-shaped deposit.
(b) Insulator coating deposit width on substrate application.
(c) Fluid application pressure.
(d) Liquid film shape ("leaf" or "triangular").
Note: Nozzle used was commercially available Nordson Corp. Part Number 050-022.

EXAMPLE 4

| DISTANCE (L) BETWEEN NOZZLE ORIFICE AND SUBSTRATE | | FAN WIDTH AT SUBSTRATE | | | | |
|---|---|---|---|---|---|---|
| | | 5 mm | 8 mm | 10 mm | 12 mm | 15 mm |
| 5 mm | (a) | None | None | | | |
| | (b) | 8 mm | 10 mm | | | |
| | (c) | 4.2 Kg/cm² | 6.0 Kg/cm² | | | |
| | (d) | Leaf | Triangular | | | |
| 7.5 mm | (a) | None | None | None | | |

-continued
EXAMPLE 4

| DISTANCE (L) BETWEEN NOZZLE ORIFICE AND SUBSTRATE | | FAN WIDTH AT SUBSTRATE | | | |
|---|---|---|---|---|---|
| | | 5 mm | 8 mm | 10 mm | 12 mm | 15 mm |
| | (b) | 8–9 mm | 12 mm | 13–14 mm | | |
| | (c) | 4.0 Kg/cm² | 5.8 Kg/cm² | 6.7 Kg/cm² | | |
| | (d) | Leaf | Triangular | Triangular | | |
| 10 mm | (a) | None | None | None | None | |
| | (b) | 9 mm | 12 mm | 13–14 mm | 16 mm | |
| | (c) | 3.9 Kg/cm² | 5.2 Kg/cm² | 5.7 Kg/cm² | 6.4 Kg/cm² | |
| | (d) | Leaf | Triangular | Triangular | Triangular | |
| 12.5 mm | (a) | None | None | None | None | |
| | (b) | 9 mm | 12 mm | 13–14 mm | 14–15 mm | |
| | (c) | 3.8 Kg/cm² | 5.2 Kg/cm² | 5.6 Kg/cm² | 5.8 Kg/cm² | |
| | (d) | Leaf | Triangular | Triangular | Triangular | |
| 15 mm | (a) | None | None | one | 1–2 | 10 |
| | (b) | 9–10 mm | 13 mm | 14–15 mm | 16 mm | 18 mm |
| | (c) | 4.0 Kg/cm² | 4.9 Kg/cm² | 5.5 Kg/cm² | 5.8 Kg/cm² | 6.9 Kg/cm² |
| | (d) | Leaf | Leaf | Leaf | Leaf | Leaf |
| 20 mm | (a) | None | 10 | 20 | 50 | |
| | (b) | 8–9 mm | 13–14 mm | 16 mm | 17–18 mm | |
| | (c) | 4.1 Kg/cm² | 4.9 Kg/cm² | 5.4 Kg/cm² | 5.7 Kg/cm² | |
| | (d) | Leaf | Leaf | Triangular | Triangular | |

Legend:
(a) Number of splashes within 10 mm² square area immediately adjacent stripe-shaped deposit.
(b) Insulator coating deposit width on substrate application.
(c) Fluid application pressure
(d) Liquid film shape ("leaf" or "triangular")
Note: Nozzle used was commercially available Nordson Corp. Part number 050-022.

As can be seen by reference to Examples 1–4, both leaf shaped and fan shaped liquid films were formed. Typically, the leaf-shaped films produced splashfree coatings, although occasionally under conditions where pressures were greatest and the distances between the nozzle orifice and the substrate were largest, undesirable splashing did result. For example, in Example 1 at an orifice-to-substrate distance of 15 mm and a pressure of 5.2 Kg/cm², one splash was noted with a leaf-shaped pattern. In Example 2, all leaf-shaped patterns produced splash-free results. In Example 3, splashfree results with a leaf-shaped pattern did not result at nozzle orifice-to-substrate distances of 20 mm at pressures of 3.3 Kg/cm² and 3.8 Kg/cm². In Example 4, splashfree results with a leaf-shaped pattern did not result at a substrate-to-orifice distance of 20 mm at a pressure of 4.9 Kg/cm².

Figure 11:
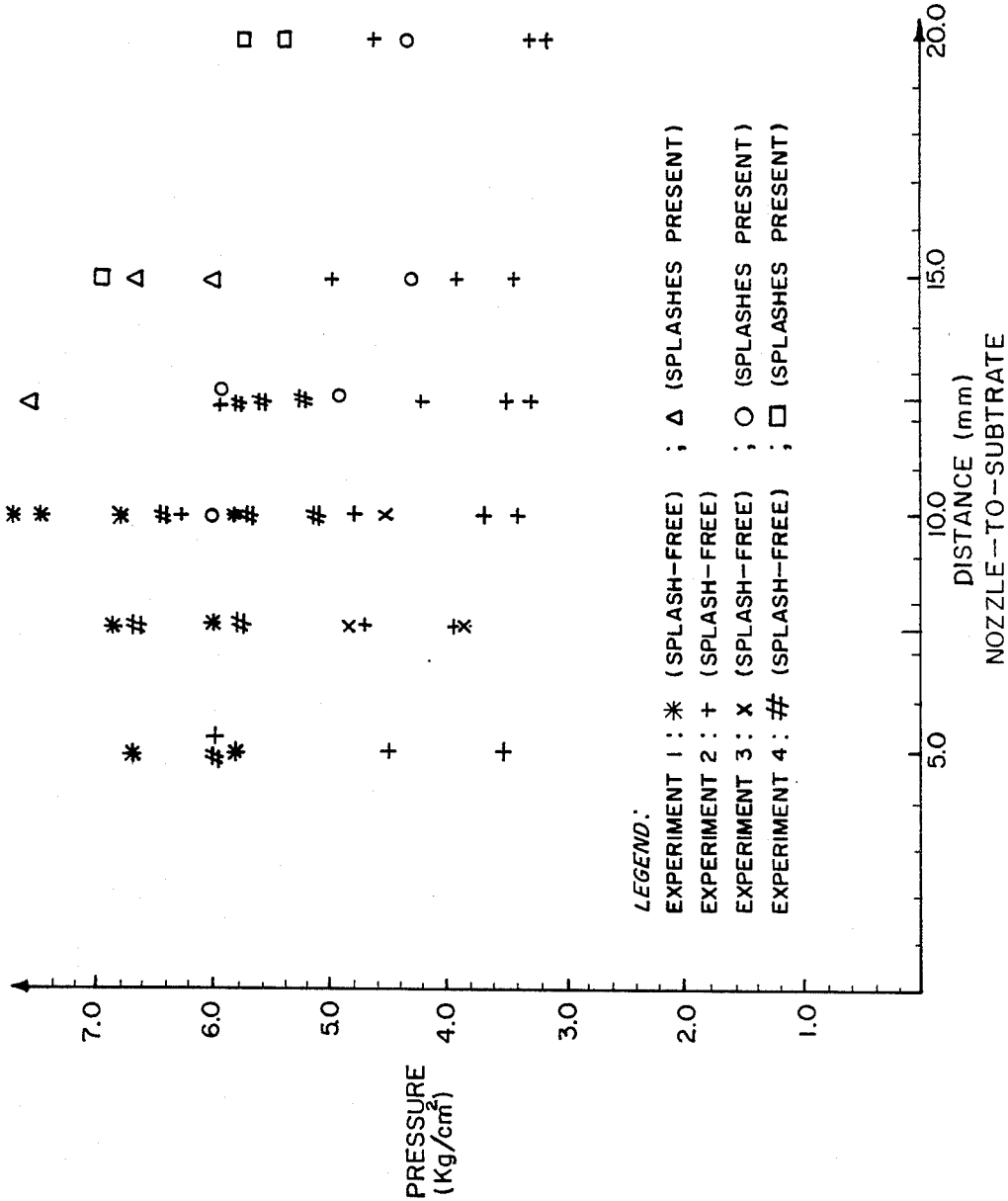

With reference to Examples 1–4, it will also be observed that in most instances triangular-shaped films also produced splashfree insulative coatings on the substrate. In Example 2, all of the triangular shaped liquid films showed splashfree results. In Examples 1, 3 and 4, splashfree results with triangular liquid films tended to decrease as the combination of pressure and orifice-to-substrate distance increased. This tendency is apparent from FIG. 11, which is a plot of the results, splashfree or splashes present, for different triangular liquid films produced at varying combinations of liquid application pressure of the airless nozzle (vertical axis) and airless nozzle orifice-to-substrate distance (horizontal axis). At nozzle-to-substrate distances of 10 mm and below, in accordance with the method of this invention, splashfree coatings with triangular films resulted regardless of the pressure up to pressures of approaching 8 Kg/cm². At nozzle-to-substrate distances of 12.5 mm, splash-free results with triangular films generally occurred, although not always, at pressures of 6 Kg/cm² or less. At 15 mm to 20 mm nozzle-to-substrate distances, splash-free results with triangular films occurred when the pressure was reduced below 5 Kg/cm².

While the invention has been described in connection with triangular liquid films produced with insulative coatings of specific viscosities (125 cps-155 cps at 20° C.) which were subjected to varying application pressures in the approximate 3–8 Kg/cm² range, those skilled in the art will appreciate that triangular liquid films can be produced with coating materials of different viscosity to provide splashfree uniform coatings at pressures substantially below the 40–80 Kg/cm² range typically found in airless paint spraying applications without departing from the spirit and scope of the invention as defined in the claims which follow. For example, those skilled in the art will appreciate that for a given coating material as the viscosity is reduced (increased), the pressure required to produce a triangular liquid film for splashfree substrate coating purposes will correspondingly be reduced (increased).

The details of construction of the airless spray nozzle Nf, which is more particularly shown in FIG. 5, forms no part of this invention. An airless spray nozzle of the type disclosed in Boone U.S. Pat. No. 4,337,281, granted June 29, 1982, assigned to the assignee of the present application, can be used to form the dovetail or triangular shaped liquid film F in accordance with the method of this invention. The entire disclosure of U.S. Pat. No. 4,337,281 is incorporated herein by reference.

Having described the invention, what is claimed is:

1. A mask-free method of applying insulative coating to selected areas of a circuit board without applying insulative coating to regions to be left uncoated, comprising the steps of:

supplying insulative liquid coating material to a flat-pattern nozzle means at a supply pressure to produce a liquid film emission from the nozzle means in a flat pattern having a generally triangular shape with a lower horizontal base edge and an upper apex, which has a maximum width W at its lower base edge below which discrete liquid droplets of coating begin to form, and which decreases in width to an approximately zero width at a distance L above said lower base edge, said triangular shaped liquid film being substantially free of atomized particles of coating, positioning the nozzle means and circuit board at a specified distance apart relative to each other to position the circuit board in the path of the flat triangular shape liquid film pattern, producing relative movement between the nozzle means and circuit board in a direction generally transverse to the plane of the flat pattern, and controlling the liquid coating supply during relative movement between the nozzle means and circuit board to (a) supply liquid to the nozzle means when the flat pattern is directed toward the selected areas to be coated to impinge a flat liquid film thereon and thereby coat the areas to be coated, and (b) interrupt the supply of liquid to the nozzle means when the flat pattern is directed toward the regions to be left uncoated to terminate emission of the flat liquid film and prevent deposit thereof on the regions to be left uncoated.

2. The method of claim 1 wherein the insulative liquid coating material is supplied at a pressure below the equivalent of approximately 8 $Kg/cm^2$ for a coating viscosity of approximately 125–155 cps at 20° C.

3. The method of claim 2 wherein the nozzle means and circuit board are spaced apart at a distance of approximately 20 mm or less.

4. The method of claim 3 wherein the nozzle means and circuit board are spaced apart a distance of approximately 15 mm or less and the insulative coating material is supplied at a pressure below the equivalent of approximately 5 $Kg/cm^2$ for a coating viscosity of approximately 125–155 cps at 20° C.

5. The method of claim 4 wherein the nozzle means and circuit board are spaced apart a distance of approximately 12.5 mm or less and the insulative coating material is supplied at a pressure below the equivalent of approximately 6 $Kg/cm^2$ for a coating viscosity of 125–155 cps at 20° C.

6. The method of claim 5 wherein the nozzle means and circuit board are spaced apart a distance of approximately 10 mm or less and the insulative coating material is supplied at a pressure below the equivalent of approximately 8 $Kg/cm^2$ for a coating viscosity of approximately 125–155 cps at 20° C.

7. The method of claim 1 wherein the distance between the nozzle means and the circuit board does not exceed a distance of approximately $\frac{2}{3}$ L.

* * * * *